United States Patent
Glover et al.

(10) Patent No.: US 8,054,627 B2
(45) Date of Patent: Nov. 8, 2011

(54) SYSTEM AND METHOD FOR DETERMINING AIR DENSITY BASED ON TEMPERATURE SENSOR DATA

(75) Inventors: Troy Williams Glover, Raleigh, NC (US); Michael Sean June, Raleigh, NC (US); Whitcomb Randolph Scott, III, Chapel Hill, NC (US); Robert Salguero Smith, Dupont, WA (US)

(73) Assignee: International Business Machines Corporation, Armonk, NY (US)

( * ) Notice: Subject to any disclaimer, the term of this patent is extended or adjusted under 35 U.S.C. 154(b) by 719 days.

(21) Appl. No.: 12/033,149

(22) Filed: Feb. 19, 2008

(65) Prior Publication Data

US 2009/0249862 A1    Oct. 8, 2009

(51) Int. Cl.
H05K 7/20    (2006.01)
(52) U.S. Cl. .................................. 361/695; 361/697
(58) Field of Classification Search .................. 361/695, 361/697, 694, 696
See application file for complete search history.

(56) References Cited

U.S. PATENT DOCUMENTS

| | | | | |
|---|---|---|---|---|
| 2,966,047 | A * | 12/1960 | De Paravicini | 62/335 |
| 5,787,971 | A * | 8/1998 | Dodson | 165/121 |
| 5,986,882 | A * | 11/1999 | Ekrot et al. | 361/679.47 |
| 6,106,282 | A | 8/2000 | Humburg et al. | |
| 6,202,403 | B1 | 3/2001 | Laborie et al. | |
| 6,280,318 | B1 * | 8/2001 | Criss-Puszkiewicz et al. | 454/184 |
| 6,336,592 | B1 * | 1/2002 | Russell et al. | 236/49.3 |
| 6,397,929 | B1 * | 6/2002 | Sterner | 165/80.3 |
| 6,595,005 | B1 * | 7/2003 | Immel | 62/3.7 |
| 6,621,990 | B1 * | 9/2003 | Beehler et al. | 399/38 |
| 6,634,939 | B2 * | 10/2003 | Johnson | 454/238 |
| 6,727,422 | B2 * | 4/2004 | Macris | 136/201 |
| 6,813,150 | B2 | 11/2004 | King et al. | |
| 6,824,362 | B2 | 11/2004 | Dodson, III | |
| 7,110,254 | B2 * | 9/2006 | Hara et al. | 361/679.26 |
| 7,215,541 | B2 * | 5/2007 | Nelson | 361/690 |
| 7,538,509 | B1 * | 5/2009 | Glover et al. | 318/481 |
| 7,591,302 | B1 * | 9/2009 | Lenehan et al. | 165/247 |
| 2001/0011473 | A1 * | 8/2001 | Marshall et al. | 73/23.34 |
| 2004/0202534 | A1 | 10/2004 | Inoue et al. | |
| 2005/0019162 | A1 | 1/2005 | Delano et al. | |
| 2006/0291994 | A1 | 12/2006 | Bok et al. | |
| 2007/0027580 | A1 | 2/2007 | Ligtenberg et al. | |
| 2007/0034702 | A1 | 2/2007 | Rixen et al. | |
| 2007/0240019 | A1 * | 10/2007 | Brady et al. | 714/43 |
| 2008/0140819 | A1 * | 6/2008 | Bailey et al. | 709/223 |
| 2008/0304229 | A1 * | 12/2008 | June et al. | 361/687 |
| 2009/0205416 | A1 * | 8/2009 | Campbell et al. | 73/202.5 |
| 2009/0223234 | A1 * | 9/2009 | Campbell et al. | 62/127 |

OTHER PUBLICATIONS

"Device for sensing altitude using temperature changes," IBM. Technical Disclosure. IP.com Prior Art Disclosure. #IPCOM000154538D. Jul. 5, 2007.*

(Continued)

Primary Examiner — Lisa Caputo
Assistant Examiner — Punam Roy
(74) Attorney, Agent, or Firm — Cynthia G. Seal; Jeffrey L. Streets

(57) ABSTRACT

A computer system and method for measuring air density in a computer chassis. The computer chassis includes a fan, an ambient air temperature sensor, and a heat-generating device with a heat sink, a heat sink temperature sensor, and a controller. The controller controls the fan speed and applies a known amount of thermal energy to the heat sink, then determines the air density from the difference in temperature between the ambient air and the heat sink. The controller may then use the air density determination to adjust the air flow rate through the computer chassis to provide a proper air flow rate for cooling.

15 Claims, 1 Drawing Sheet

OTHER PUBLICATIONS

"Thermal Air Flow Detection Assembly," IBM. Technical Disclosure. IP.com Prior Art Disclosure. #IPCOM000068500D. Feb. 20, 2005.*

Mohammed Tahmaspur and Mulugeta K. Berhe, Thermal Design of the TW-150 Passive Optical Network Access Unit: Part II, 2002 Inter Society Conference on Thermal Phenomena, 7 pages.

* cited by examiner

SYSTEM AND METHOD FOR DETERMINING AIR DENSITY BASED ON TEMPERATURE SENSOR DATA

BACKGROUND OF THE INVENTION

1. Field of the Invention

The present invention relates to the determination of air density for use in controlling the cooling of electronic systems, such as computers.

2. Description of the Related Art

Cooling fans are commonly used to cool electronic devices, such as computers. For example, on-board cooling fans are installed in individual computer servers, and blower modules are often included within multi-blade chassis or enclosures to cool multiple blade servers housed in the chassis. It is recognized in the design of air cooling systems that air density decreases with increasing altitude, and that lower air density requires greater volumes of air flow to achieve an equivalent level of cooling.

Some cooling fans are operated at a single-speed that is fast enough to achieve the desired air flow and cooling at any altitude. Consequently, these fans run faster than necessary at lower altitudes, resulting in a waste of energy, excessive noise and accelerated wear on the fans. Although this mode of operation is simple, it does not address the demands placed on modern computer systems.

Other systems may include an on-board altimeter within each device. Accordingly, the speed of each device's cooling fan is regulated in relation to an altitude sensed by the altimeter. One problem with such a solution is that many electronic systems, such as rack-based computer systems, have many different components or subsystems, each requiring its own cooling fan. Equipping each component or subsystem with a dedicated on-board altimeter could significantly increase the cost of the electronic system as a whole. System reliability and maintenance might also suffer because each altimeter is subject to potential failure.

Still further, the rising prevalence of notebook computers means that user-input altitude is unworkable. As the notebook computer travels from place to place, the altitude may change routinely. Current altitude information may be particularly important for a notebook computer, since unnecessary high fan speeds will drain the batteries. However, the portability of the notebook computer dictates that any altimeter device must be compact and avoid consumption of significant electrical energy.

Therefore, there is a need for an improved cooling system and method for measuring air density in a computer system. In particular, it would be desirable to have a reliable source of air density or altitude that enables greater accuracy in the control of air flow through a computer system. Accordingly, excessive air flow rates should be avoided while providing sufficient control of computer component temperatures.

SUMMARY OF THE INVENTION

One embodiment of the invention provides a method for measuring air density. The method comprises inducing air flow through a computer chassis at a known air flow rate, measuring the temperature of the air at an air intake to the computer chassis, applying a known amount of thermal energy to a heat sink disposed within the chassis, measuring the temperature of a downstream portion or fin of the heat sink while the thermal energy is being applied, determining the air density as a function of the air flow rate and the difference between the intake air temperature and the heat sink temperature, and adjusting the air flow rate through the computer chassis in consideration of the air density. Typically, the air flow is induced by a fan, and the step of adjusting the air flow rate includes controlling the fan speed. Optionally, the steps of applying a known amount of thermal energy and determining the air density are performed periodically, such as at initial setup of a computer system. The thermal energy applied to the heat sink may be produced by a dedicated resistance heater or a processor receiving a substantially constant processor load.

Another embodiment of the invention provides a computer system comprising a computer chassis. The computer chassis includes a fan for inducing air flow through the chassis at a controlled air flow rate, an ambient air temperature sensor positioned near an ambient air intake to the chassis, and a heat-generating device in direct thermal communication with a heat sink, wherein the heat sink is disposed in the chassis and exposed to the ambient air flow downstream of the ambient air temperature sensor. The computer chassis also includes a heat sink temperature sensor in direct thermal communication with the heat sink, and a controller receiving a temperature signal from the ambient air temperature sensor and a temperature signal from the heat sink temperature sensor. The controller controls the fan speed in consideration of the difference between the intake air temperature and the heat sink temperature while air is flowing at the controlled air flow rate and the known amount of thermal energy is applied to the heat-generating device.

Yet another embodiment of the invention provides a method for measuring air density. The method comprises inducing air flow through a computer chassis at a known air flow rate, measuring the temperature of the air at an air intake to the computer chassis, applying a known amount of thermal energy to a heat sink disposed within the chassis by applying a constant electrical load to dedicated resistance heater, measuring the temperature of the heat sink, determining the air density as a function of the air flow rate and the difference between the intake air temperature and the heat sink temperature when the known amount of thermal energy is applied, and adjusting the air flow rate through the computer chassis in consideration of the air density.

A still further embodiment of the invention provides a method for measuring air density comprising inducing air flow through a computer chassis at a known air flow rate, measuring the temperature of the air at an air intake to the computer chassis, applying a known amount of thermal energy to a heat sink disposed within the chassis by applying a constant processor load to a processor, measuring the temperature of the heat sink, determining the air density as a function of the air flow rate and the difference between the intake air temperature and the heat sink temperature when the known amount of thermal energy is applied, and adjusting the air flow rate through the computer chassis in consideration of the air density.

Other embodiments, aspects, and advantages of the invention will be apparent from the following description and the appended claims.

DETAILED DESCRIPTION OF PREFERRED EMBODIMENTS

Figure 1:
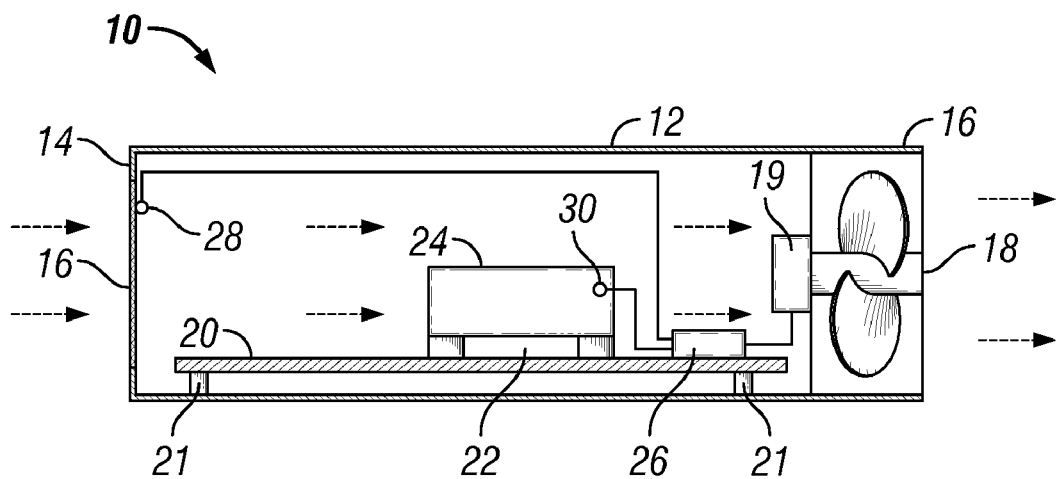
FIG. 1 is a schematic side view of a computer chassis.

One embodiment of the present invention provides a method for measuring air density. As used herein, air density, air pressure and altitude are each considered to be interrelated conditions that may substitute for the others, such that measuring or determining one of these conditions enables the determination of the other interrelated conditions. The present disclosure focuses on air density as the condition that is more relevant to heat transfer and as the condition that is more fundamental to the measurements of the embodiments described.

An embodiment of the method includes inducing air flow through a computer chassis at a known air flow rate, and measuring the temperature of the air at an air intake to the computer chassis. A known amount of thermal energy is then applied to a heat sink disposed within the chassis. Measuring the temperature of the heat sink under these conditions enables the determination of air density as a function of the air flow rate and the difference between the intake air temperature and the heat sink temperature. For example, the air density may be determined in accordance with the equation below.

$$(\text{air density}) = \frac{(\text{thermal energy generated})}{(\text{vol. air flow rate}) * (\text{specific heat of air}) * (T_{air\ intake} - T_{heat\ sink})]}$$

The air flow rate through the computer chassis may be adjusted in consideration of the air density. Typically, the air flow is induced by a fan, and the air flow rate is adjusted by controlling the fan speed. The heat sink temperature is preferably measured on a downstream fin of the heat sink.

In another embodiment, the method is performed periodically so that the fan speed reflects the current air density. For example, the method may be performed during initial setup or at system startup. In yet another embodiment, the application of a known amount of thermal energy to the heat sink includes applying a constant electrical load to dedicated resistance heater. Using a dedicated resistance heater allows the air density measurement to occur at any time that the computer system is turned on, does not effect other operations of the computer system, and the location of the resistance heater within the computer chassis can be independently selected for optimal measurement. Alternatively, the thermal energy may be applied using a constant processor load to a processor on the motherboard, wherein the processor has a heat sink mounted for cooling the processor. The use of the processor avoids adding further components to the computer system, but may temporarily require greater control over the processor load so as to produce a constant thermal load on the associated heat sink.

Yet another embodiment of the invention provides a computer system. The system comprises a computer chassis including a fan for inducing air flow through the chassis at a controlled air flow rate and an ambient air temperature sensor positioned near an ambient air intake to the chassis. A heat-generating device is also included in direct thermal communication with a heat sink, wherein the heat sink is disposed in the chassis and exposed to the ambient air flow downstream of the ambient air temperature sensor. A heat sink temperature sensor is positioned in direct thermal communication with the heat sink. A temperature signal from the ambient air temperature sensor and a temperature signal from the heat sink temperature sensor are received by a controller, wherein the controller controls the fan speed in consideration of the difference between the intake air temperature and the heat sink temperature while air is flowing at the controlled air flow rate and the known amount of thermal energy is applied to the heat-generating device. Optionally, the controller may be a baseboard management controller.

The present systems and methods of measuring air density may be applied to a variety of electronic systems, such as notebook computers, desktop computers, servers, multi-server computer systems and/or rack-based computer systems. The servers or other modules may have their own fan assembly or share a common fan assembly. The method may be performed in any one or more of the electronic systems and may use the air density determination for fan speed control within the same system and/or share the air density determination with other systems. Each system or module may then regulate fan speed according to an existing fan control algorithm that takes air density into consideration. The controller may control various fan operational parameters, such as the fan speed, the number of fans recruited, the pitch of variable pitch fan blades, the position of automated dampers, and combinations thereof. In accordance with existing fan control algorithms, the controller may also consider a variety of other performance parameters, such as other air or component temperature measurements, server workload, and processor activity level.

The invention has numerous advantages over conventional systems that operate at a single fan speed or range of fan speeds without regard to air density or altitude. The invention also has advantages over conventional altitude-dependent fan-speed control techniques, which require a completely dedicated altimeter device. The use of one or more existing temperature sensors minimizes the system cost and improves system reliability by minimizing the number of components used in the system.

FIG. 1 is a schematic side view of a computer system 10 including a computer chassis 12. The chassis 12 has a front or proximal end 14 having an air intake grill 16 and a back or distal end 16 having a fan or fan assembly 18 for drawing air through the chassis. The fan or fan assembly 18 includes a variable speed fan motor 19 that operates under the control of a controller 26.

A motherboard 20 is secured to the chassis or motherboard tray by standoffs 21 and includes various components, including a processor, that generally require contact with air flow for cooling the components. A heat-generating device 22, such as a dedicated resistance heater or a processor secured in a socket, is mounted on the motherboard 20 with a heat sink 24 secured in direct thermal communication with the device 22. The heat-generating device 22 is under the control of the controller 26 so that the controller can determine the amount of thermal energy being applied to the heat sink 24. The heat sink 24 includes high surface area fins (only a side of one fin is shown) that extend substantially parallel to the direction of air flow.

A first thermal sensor 28 is secured adjacent the air intake grill 16 to measure the air intake temperature and send an air intake temperature signal to the controller 26. A second thermal sensor 30 is secured on a downstream portion or fin of the heat sink 24 to measure the heat sink temperature and second a heat sink temperature signal to the controller 26. Because the controller 26 can control the heat-generating device 22 and control the fan motor 19, and because the controller 26 monitors the temperature signal from the air intake thermal sensor 28 and monitors the temperature signal from the heat sink thermal sensor 30, the controller 26 is able to determine the density of the air flowing through the chassis.

Figure 2:
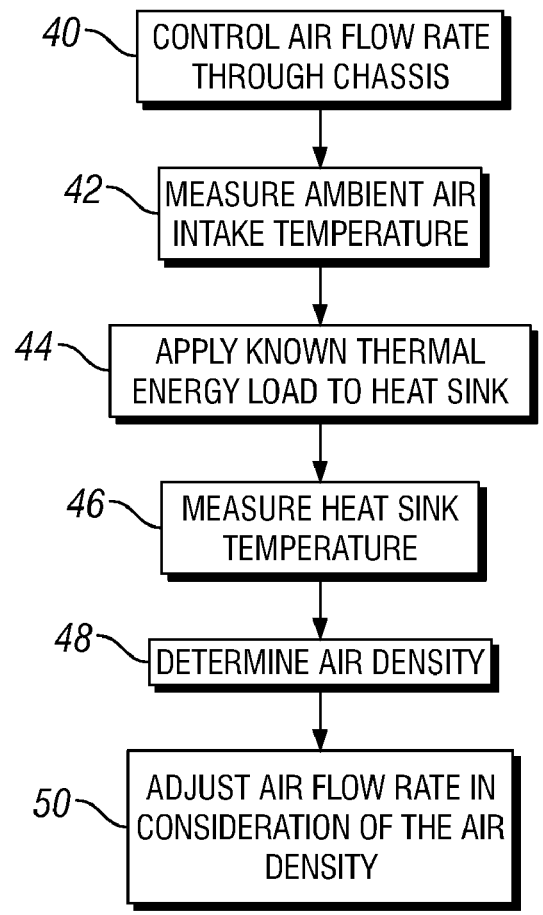
FIG. 2 is a logic diagram of one embodiment of a method for controlling the air flow rate through the computer chassis.

FIG. 2 is a logic diagram of one embodiment of a method for measuring the density of air flowing through the computer chassis. Such method may be executed by the controller in hardware or software embodiments. For example, the controller may include a processor capable of executing a computer program product that is loaded or read from a data storage device, wherein the computer program product includes computer executable instructions.

In accordance with this embodiment, the air flow is induced through the chassis and controlled at a known air flow rate (step 40) and the ambient air intake temperature is measured (step 42). A known amount of thermal energy is applied to a heat sink disposed in the chassis for exposure to the air flow (step 44) and the temperature of the heat sink is measured (step 46). Then, the air density can be determined (step 48) as a function of the air flow rate and the difference between the intake air temperature and the heat sink temperature when the known amount of thermal energy is applied. Having determined the air density, the air flow rate through the computer chassis may be adjusted in consideration of the air density (step 50).

Furthermore, the rate of heat transfer from the heat sink will change if the air contacting the heat sink includes a significant amount of another gas, such as halon. The term "halon" generally refers to any of a group of compounds that include partially or fully halogenated alkanes. Halons, such as Halon 1211 (bromochlorodifluoromethane, $CF_2ClBr$), are sometimes used as gaseous fire suppression agents.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for measuring air density, comprising:
   inducing air flow through a computer chassis at a known air flow rate;
   measuring the temperature of the air at an air intake to the computer chassis;
   applying a known amount of thermal energy to a heat sink disposed within the chassis;
   measuring the temperature of a downstream portion or fin of the heat sink;
   determining the air density as a function of the air flow rate and the difference between the intake air temperature and the heat sink temperature when the known amount of thermal energy is applied; and
   adjusting the air flow rate through the computer chassis in consideration of the air density.

2. The method of claim 1, wherein the air flow is induced by a fan, and wherein the step of adjusting the air flow rate includes controlling the fan speed.

3. The method of claim 2, wherein the measured air intake temperature and the measure heat sink temperature are input to a baseboard management controller, and wherein the baseboard management controller controls the fan speed.

4. The method of claim 1, wherein the steps of applying a known amount of thermal energy and determining the air density are performed periodically.

5. The method of claim 1, wherein the steps of applying a known amount of thermal energy and determining the air density are performed during initial setup.

6. A method for measuring air density, comprising:
   inducing air flow through a computer chassis at a known air flow rate;
   measuring the temperature of the air at an air intake to the computer chassis;
   applying a known amount of thermal energy to a heat sink disposed within the chassis by applying a constant electrical load to dedicated resistance heater;
   measuring the temperature of the heat sink;
   determining the air density as a function of the air flow rate and the difference between the intake air temperature and the heat sink temperature when the known amount of thermal energy is applied; and
   adjusting the air flow rate through the computer chassis in consideration of the air density.

7. The method of claim 6, wherein the air flow is induced by a fan, and wherein the step of adjusting the air flow rate includes controlling the fan speed.

8. The method of claim 6, wherein the steps of applying a known amount of thermal energy and determining the air density are performed periodically.

9. The method of claim 6, wherein the steps of applying a known amount of thermal energy and determining the air density are performed during initial setup.

10. The method of claim 6, wherein the measured air intake temperature and the measure heat sink temperature are input to a baseboard management controller, and wherein the baseboard management controller controls the fan speed.

11. A method for measuring air density, comprising:
    inducing air flow through a computer chassis at a known air flow rate;
    measuring the temperature of the air at an air intake to the computer chassis;
    applying a known amount of thermal energy to a heat sink disposed within the chassis by applying a constant processor load to a processor;
    measuring the temperature of the heat sink;
    determining the air density as a function of the air flow rate and the difference between the intake air temperature and the heat sink temperature when the known amount of thermal energy is applied; and
    adjusting the air flow rate through the computer chassis in consideration of the air density.

12. The method of claim 11, wherein the air flow is induced by a fan, and wherein the step of adjusting the air flow rate includes controlling the fan speed.

13. The method of claim 11, wherein the steps of applying a known amount of thermal energy and determining the air density are performed periodically.

14. The method of claim 11, wherein the steps of applying a known amount of thermal energy and determining the air density are performed during initial setup.

15. The method of claim 12, wherein the measured air intake temperature and the measure heat sink temperature are input to a baseboard management controller, and wherein the baseboard management controller controls the fan speed.

* * * * *